US011508867B2

(12) United States Patent
Lu et al.

(10) Patent No.: US 11,508,867 B2
(45) Date of Patent: Nov. 22, 2022

(54) SINGLE PHOTON AVALANCHE DIODE DEVICE

(71) Applicant: Adaps Photonics Inc., San Jose, CA (US)

(72) Inventors: Ching-Ying Lu, San Jose, CA (US); Yangsen Kang, San Jose, CA (US); Shuang Li, San Jose, CA (US); Kai Zang, San Jose, CA (US)

(73) Assignee: ADAPS PHOTONICS INC., San Jose, CA (US)

( * ) Notice: Subject to any disclaimer, the term of this patent is extended or adjusted under 35 U.S.C. 154(b) by 243 days.

(21) Appl. No.: 16/775,101

(22) Filed: Jan. 28, 2020

(65) Prior Publication Data
US 2021/0234057 A1 Jul. 29, 2021

(51) Int. Cl.
| | | |
|---|---|---|
| *H01L 31/10* | (2006.01) | |
| *H01L 31/107* | (2006.01) | |
| *H01L 31/02* | (2006.01) | |
| *H01L 27/146* | (2006.01) | |
| *H04N 5/374* | (2011.01) | |
| *C30B 25/18* | (2006.01) | |

(52) U.S. Cl.
CPC .......... *H01L 31/107* (2013.01); *C30B 25/18* (2013.01); *H01L 27/14636* (2013.01); *H01L 31/02027* (2013.01); *H04N 5/374* (2013.01)

(58) Field of Classification Search
CPC .......... H01L 31/107; H01L 27/14636; H01L 31/02027; H01L 27/14629; H01L 27/1463; H01L 27/14634; H01L 27/1464; C30B 25/18; H04N 5/374
See application file for complete search history.

(56) References Cited

U.S. PATENT DOCUMENTS

| | | | | |
|---|---|---|---|---|
| 5,057,892 A | * | 10/1991 | Iwanczyk | .......... H01L 31/0288 257/461 |
| 10,204,950 B1 | * | 2/2019 | Yamashita | .......... H01L 27/1464 |
| 2013/0292741 A1 | * | 11/2013 | Huang | .......... H01L 31/1075 257/186 |
| 2015/0054111 A1 | * | 2/2015 | Niclass | .......... H01L 31/107 257/438 |

(Continued)

FOREIGN PATENT DOCUMENTS

| | | |
|---|---|---|
| KR | 20170132467 A | 12/2017 |
| WO | WO2019018846 A2 | 1/2019 |

OTHER PUBLICATIONS

International Search Report and Written Opinion for PCT/US2021/01467, dated Apr. 19, 2021.

*Primary Examiner* — S M Sohel Imtiaz

(57) ABSTRACT

The present invention provides a single photon avalanche diode device. The device has a logic substrate comprising an upper surface. The device has a sensor substrate bonded to an upper surface of the logic substrate. In an example, the sensor substrate comprises a plurality of pixel elements spatially disposed to form an array structure. In an example, each of the pixel elements has a passivation material, an epitaxially grown silicon material, an implanted p-type material configured in a first portion of the epitaxially grown material, an implanted n-type material configured in a second portion of the epitaxially grown material, and a junction region configured from the implanted p-type material and the implanted n-type material.

26 Claims, 10 Drawing Sheets

(56) References Cited

U.S. PATENT DOCUMENTS

2017/0104026 A1* 4/2017 Roch ............... H01L 31/1832
2019/0097075 A1* 3/2019 Rae ................ H01L 27/1443
2019/0393256 A1* 12/2019 Luo ............... H01L 27/14649
2020/0279877 A1* 9/2020 Kim .............. H01L 27/14614

* cited by examiner

Top View

STI Below DTI (the rest is the same as standard design)

SINGLE PHOTON AVALANCHE DIODE DEVICE

BACKGROUND OF INVENTION

The present invention relates generally to sensing devices. More particularly, the present invention provides a method and device for sensing light using a photo diode technique, and in particular a single photon avalanche diode technique in combination with one or more complementary metal oxide semiconductor (CMOS) devices. Merely by way of example, the device can be used sensor applications, time of flight applications, LiDAR applications, among others. But it will be recognized that the invention has a much broader range of applicability.

Research and development in integrated microelectronics have continued to produce astounding progress with sensor devices. Many examples of photo diodes exist. For example, a photodiode is a p-n junction or PIN structure. When a photon of sufficient energy strikes the diode, it creates an electron-hole pair. This mechanism is also known as the inner photoelectric effect. If the absorption occurs in the junction's depletion region, or one diffusion length away from it, these carriers are swept from the junction by the built-in electric field of the depletion region. Thus holes move toward the anode, and electrons toward the cathode, and a photocurrent is produced. The total current through the photodiode is the sum of the dark current (current that is generated in the absence of light) and the photocurrent, so the dark current must be minimized to maximize the sensitivity of the device. See, Photodiode, Wikipedia.

Another example of a photo diode is called an "avalanche photodiode." The avalanche photodiodes are photodiodes with structure optimized for operating with high reverse bias, approaching the reverse breakdown voltage. This allows each photo-generated carrier to be multiplied by avalanche breakdown, resulting in internal gain within the photodiode, which increases the effective responsivity of the device.

Although highly successful, many limitations exist with these convention photodiodes. These devices are difficult to manufacture. These devices also have poor signal to noise ratios for sensitive applications. Additionally, such photodiodes are often not capable of being integrated with complex integrated circuit devices. Power consumption is also high, thereby limiting the applications for these devices. These and other limitations of conventional photo didoes may be further described throughout the present specification and more particularly below.

From the above, it is seen that techniques for improving sensing devices are highly desired.

SUMMARY

According to the present invention, techniques related generally to sensing devices are provided. More particularly, the present invention provides a method and device for sensing light using a photo diode technique, and in particular a single photon avalanche diode technique in combination with one or more complementary metal oxide semiconductor (CMOS) devices. Merely by way of example, the device can be used sensor applications, time of flight applications, LiDAR applications, among others. But it will be recognized that the invention has a much broader range of applicability.

In an example, the present invention provides a single photon avalanche diode device. The device has a logic substrate comprising an upper surface. In an example, the logic substrate comprises a semiconductor substrate with logic circuitry, such as those made using CMOS technology. The device has a sensor substrate bonded to an upper surface of the logic substrate. In an example, the sensor substrate comprises a plurality of pixel elements spatially disposed to form an array structure. In an example, each of the pixel elements has a passivation material, an epitaxially grown silicon material, an implanted p-type material configured in a first portion of the epitaxially grown material, an implanted n-type material configured in a second portion of the epitaxially grown material, and a junction region configured from the implanted p-type material and the implanted n-type material. Each pixel element has a deep trench region bordering the pixel element. In an example, the trench region comprises a fill material, a surrounding charge material, and a surrounding insulating material. The device also has a first contact region coupled to the implanted p-type material and a second contact region coupled to the implanted n-type material.

In an example, the single photon avalanche photodiode in operation works by biasing the device above a breakdown voltage of the device. When a photo-generated electron-hole pair reaches an avalanche region (which is a region where the electric field is above the avalanche breakdown threshold), both electrons and holes have a probability of breaking a silicon covalent bond to free another electron-hole pair in a process. The process results in a multiplication of electron-hole pairs with a gain typically larger than $10^5$-$10^6$. Therefore, a single photon detected and generating a photo-generated electron-hole pair causes a large signal pulse. Further details of the present operation can be found throughout the present specification and more particularly below.

Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved CMOS integrated circuit device and related methods for a variety of uses. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE SPECIFIC EMBODIMENTS

According to the present invention, techniques related generally to sensing devices are provided. More particularly, the present invention provides a method and device for sensing light using a photo diode technique, and in particular a single photon avalanche diode technique in combination with one or more complementary metal oxide semiconductor (CMOS) devices. Merely by way of example, the device can be used sensor applications, time of flight applications, LiDAR applications, among others. But it will be recognized that the invention has a much broader range of applicability.

Figure 1:
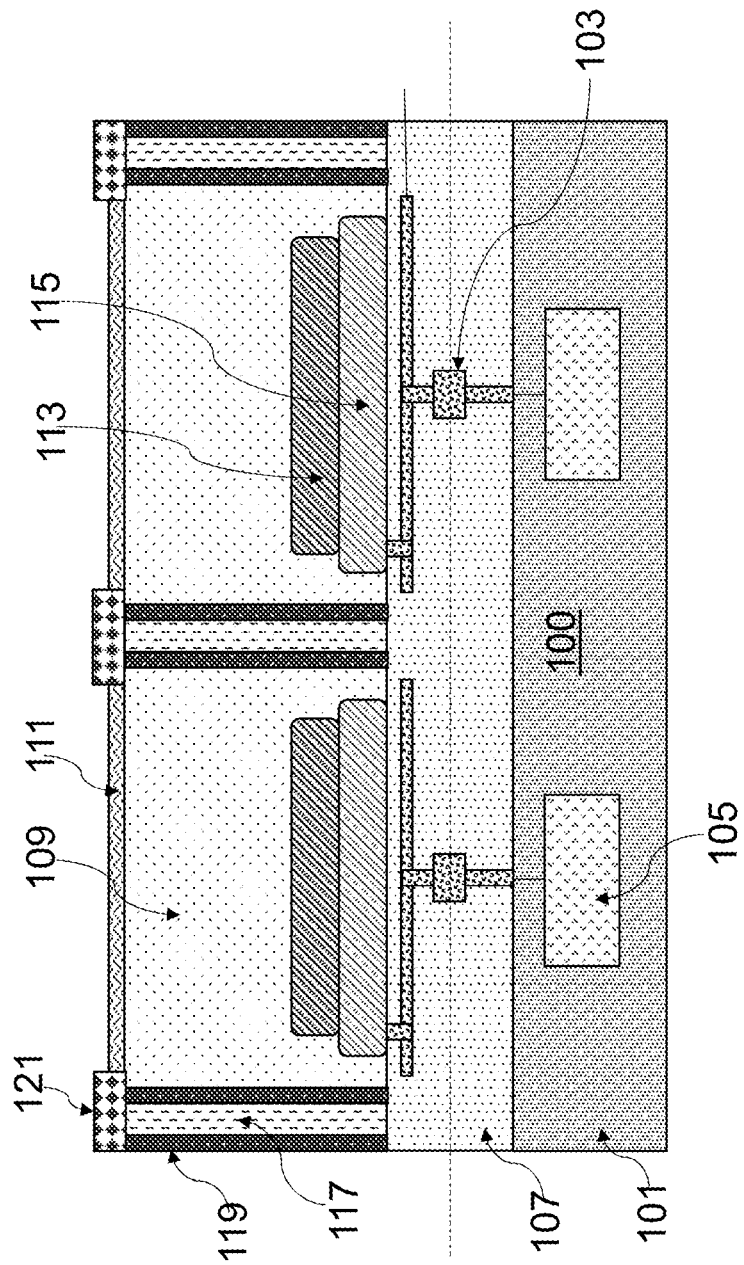
FIG. 1 is a simplified cross-sectional view diagram of a device according to an embodiment of the present invention.

FIG. 1 is a simplified cross-sectional view diagram of a device according to an embodiment of the present invention. This diagram is merely an example, which should not unduly limit the scope of the claims herein. As shown, a single photon avalanche diode device 100 is provided. The device has a semiconductor substrate 101 comprising an upper surface. As shown, the semiconductor substrate is a wafer having logic circuits, and related cells. In an example, the semiconductor substrate can be called a logic substrate. In an example, the substrate can be a complementary metal oxide silicon (CMOS) substrate, a blank or unpatterned substrate, a patterned, hybrid substrate, among others. In an example, the semiconductor substrate has a plurality of CMOS cells for logic circuitry, and can also include a plurality of memory cells, interface cells, and other circuit elements. As shown, the substrate has a bonding point 103 and logic circuits 105, which can be configured as an output, quenching, recharge circuit, among others. Of course, there can be other variations, modifications, and alternatives.

In an example, the device has a sensor substrate and bonding region 107 bonded to an upper surface of the sensor substrate at the bonding point or plane. In an example, the term sensor substrate is a semiconductor substrate having one or more sensing elements thereon. In an example, the upper surface has been planarized. In an example, the sensor substrate comprises a plurality of pixel elements 109 spatially disposed to form an array structure. In an example, the array structure is N by M, where N is 1 and greater and M is 1 and greater. In an example, N ranges from 1 to 10 or 1000 or millions or billions and M is 1 to 10 or millions or billions, among other variations. In an example, each of the pixel elements has a size ranging from 1 micron to about 100 microns, although there can be other variations. As shown, two side view diagrams of pixel elements are shown.

In an example, each of the pixel elements has a passivation material. In an example, the passivation material (which can be formed as layers) includes an oxide material, a high-K dielectric material, a nitride material, or a polyimide material, combinations thereof, and the like. In an example, each of the pixel elements is formed on an epitaxially grown silicon material. The epitaxially grown silicon material can be formed using an epitaxial reactor using silicon based precursor gases. As shown, a thickness of epitaxial material is made of a suitable thickness and is grown using a high temperature growth technique, among others. In an example, the epitaxial material is a monocrystalline silicon material, which is substantially defect free. In an example, the device has passivation material 111.

As shown, each of the pixel elements has an implanted p-type material 113 configured in a first portion of the epitaxially grown material, an implanted n-type material 115 configured in a second portion of the epitaxially grown material, and a junction region configured from the implanted p-type material and the implanted n-type material. In an example, the implanted p-type material comprises a boron material having a concentration density of 1E15 atoms/cm$^3$ to 1E18 atoms/cm$^3$. In an example, the implanted n-type material comprises a phosphorous entity or an arsenic entity having a concentration density of 1E17 atoms/cm$^3$ to 1E19 atoms/cm$^3$. Of course, there can be other variations, modifications, and alternatives. As shown, the implanted p-type material and the implanted n-type material are configured within a vicinity of the semiconductor substrate of the pixel element or near the bonding region, as shown.

As shown, each pixel element has a deep trench region 117 bordering the pixel element. In an example, the trench region comprises a fill material, a surrounding charge material, and a surrounding insulating material 119. In an example, the fill material comprises a metal material, a semiconductor material, or an insulating material. In a preferred example, the fill material is a metal material to prevent cross-talk, although the fill material can also be an insulating material, such as oxide material. In an example, the surrounding charge material is a high K dielectric material. In an example, the surrounding insulating material includes an oxide or a nitride material, among others.

In an example, the charge material configured at a deep trench isolation structure has a negative charge. In an example, high k dielectric material, such as $Al_2O_3$ deposited by atomic layer deposition techniques forms negative fixed charge at an SiO2/Al2O3 interface region. In an example, the negative fixed charge creates a positive flat band voltage shift, which causes semiconductor material near the deep trench isolation sidewall in accumulation mode rather than in a depletion mode. Additionally, spatially excluding the deep trench isolation sidewall interface from the depletion region greatly reduces chances for the interface defects to drift to the avalanche region. Accordingly, noise or the dark count rate can be greatly reduced.

In an example, the device also has a first contact region 121 coupled to the implanted p-type material and a second contact region coupled to the implanted n-type material on the opposite side of the sensor substrate. In an example, the contacts are configured as an anode and a cathode for each of the pixel elements.

In an example, the device has a bottom metal reflector, as shown. In an example, the metal reflector can be made of an aluminum material, a metal/oxide material, or a semiconductor material. In an example, the bottom reflector is configured to reflect light back into an active region of the epitaxial material or active region.

Figure 2:
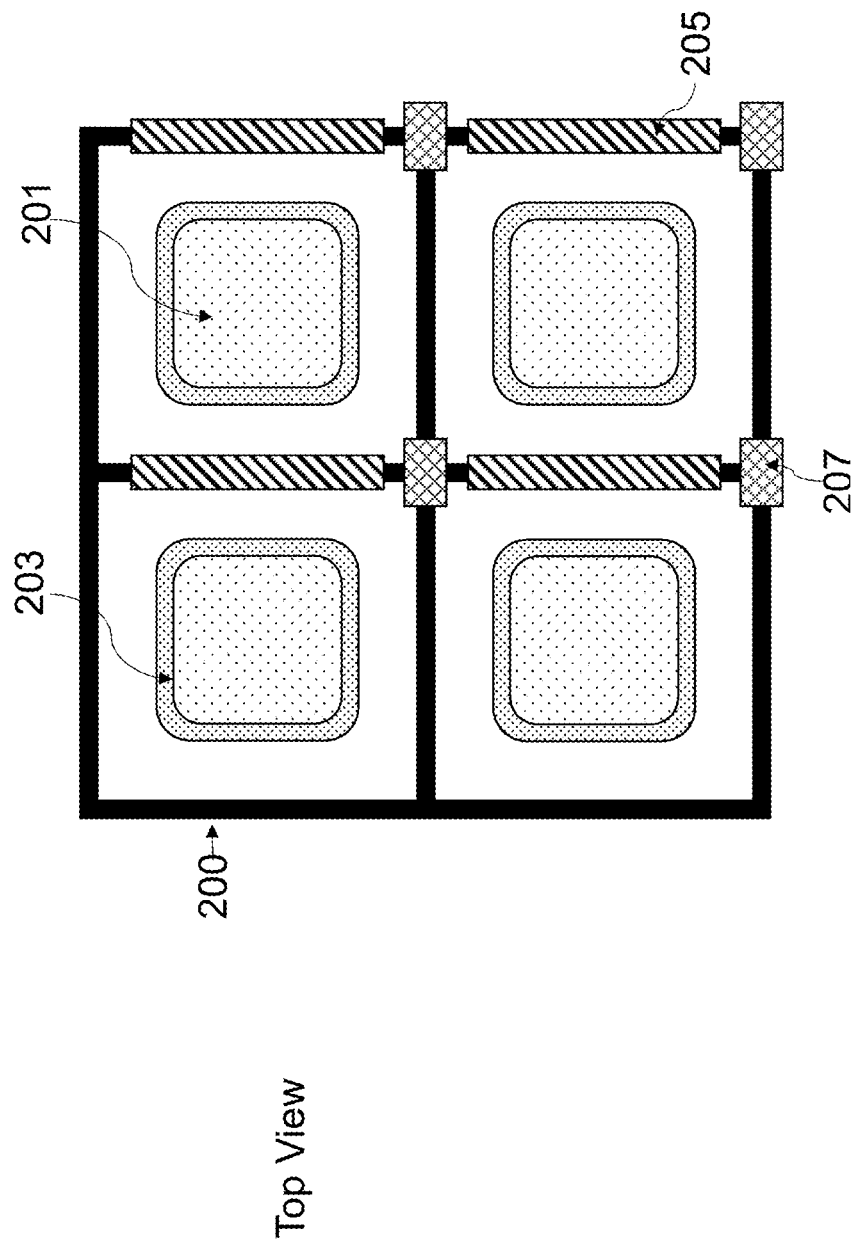
FIG. 2 is a top-view diagram of a device according to an alternative embodiment of the present invention.

FIG. 2 is a top-view diagram of a device according to an alternative embodiment of the present invention. This diagram is merely an example, which should not unduly limit the scope of the claims herein. In an example, such device includes integrated circuit elements to replace certain elements from the logic substrate, which is described herein. As shown, each pixel element 200 has a surrounding trench region, and inner active region, which is made of epitaxial material. In an example, each pixel element has the p-type implanted region 201 within the n-type implanted region 203, as shown. Each of the pixel elements is configured as a square, but can also be configured in other shapes, such as a circle, a rectangle, oval, or other variations. Om am example, each pixel region is coupled to an integrated high voltage transistor 207, and has a quenching resistor 205, as shown. Each of the transistor and resistor circuit elements are monolithically integrated with the sensor substrate and pixel elements.

Figure 3:
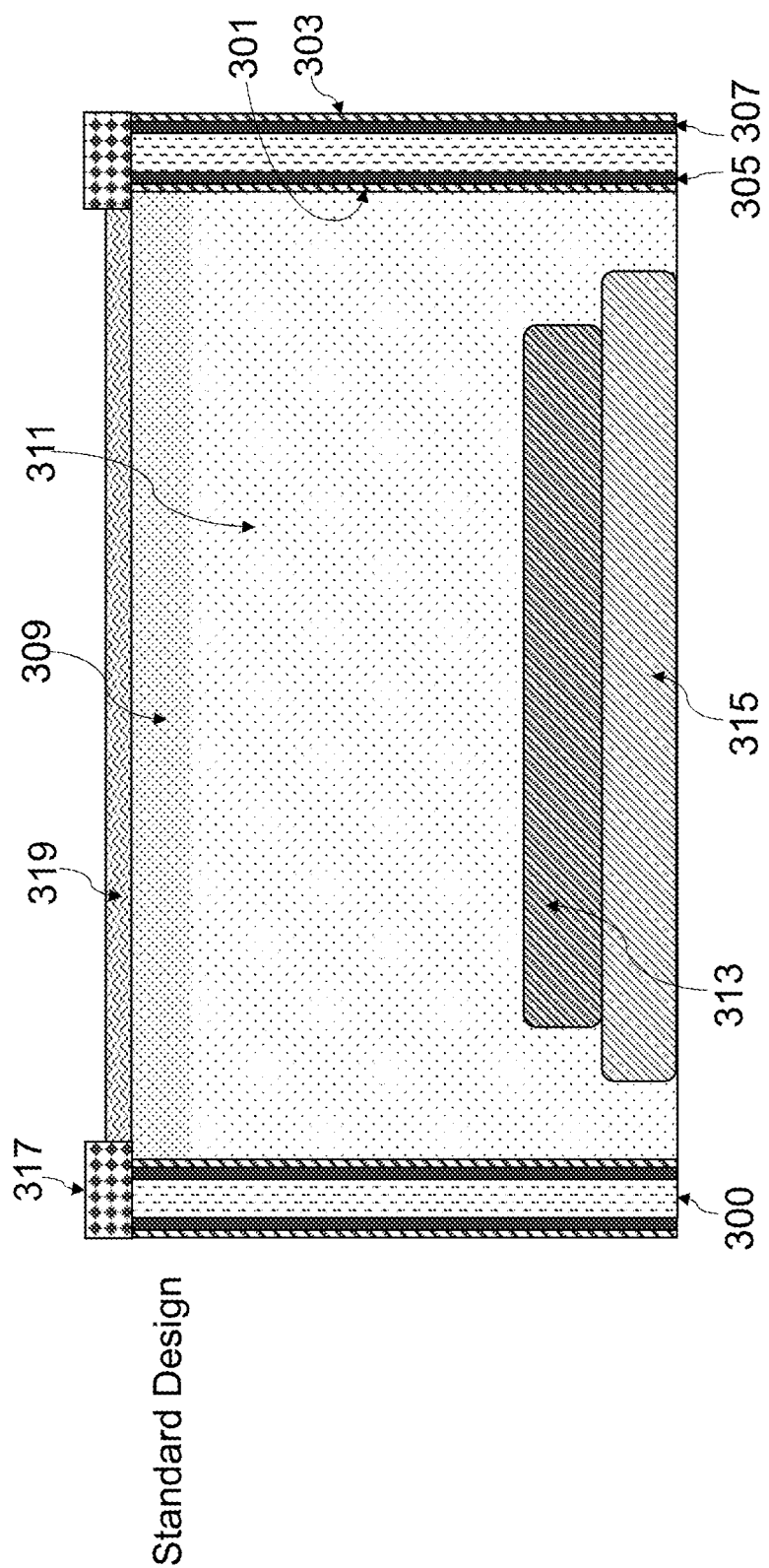
FIG. 3 is a more detailed cross-sectional view diagram of a device according to an embodiment of the present invention.

FIG. 3 is a more detailed cross-sectional view diagram of a device according to an embodiment of the present invention. This diagram is merely an example, which should not unduly limit the scope of the claims herein. As shown, the device has the surrounding trench region 300, which is configured from a deep trench isolation. The deep trench isolation is configured from an etching process.

In an example, the trench region comprises a fill material, a surrounding charge material 305, 307, and a surrounding insulating material 301 303. In an example, the surrounding insulating material includes an oxide or a nitride material, among others.

In an example, the charge material configured at a deep trench isolation structure has a negative charge. In an example, high k dielectric material, such as $Al_2O_3$ deposited by atomic layer deposition techniques forms negative fixed charge at an $SiO_2/Al_2O_3$ interface region. In an example, the negative fixed charge creates a positive flat band voltage shift, which causes semiconductor material near the deep trench isolation sidewall in accumulation mode rather than in a depletion mode. Such configuration reduces a dark count rate, leading to efficiencies with the device. In an example, as shown, the trench is filled with a conductive material, such as metal, to prevent cross-talk or other limitations leading to problems. In an example, the conductive material can also be biased at the same bias as the anode or more negative bias in reference to the anode depending upon the embodiment.

As shown, the device has a low doped epitaxial silicon region 311 coupled to a higher doped avalanche region. As shown, p+ type material 309 provides for lateral conduction and a low contact resistance. Also shown is an n type material 315 configured within the epitaxial material. The device also has a p type material 313 overlying the n type material.

In an example, the device also has contact region 317 coupled to the p type material and an overlying passivation material 319.

Figure 4:
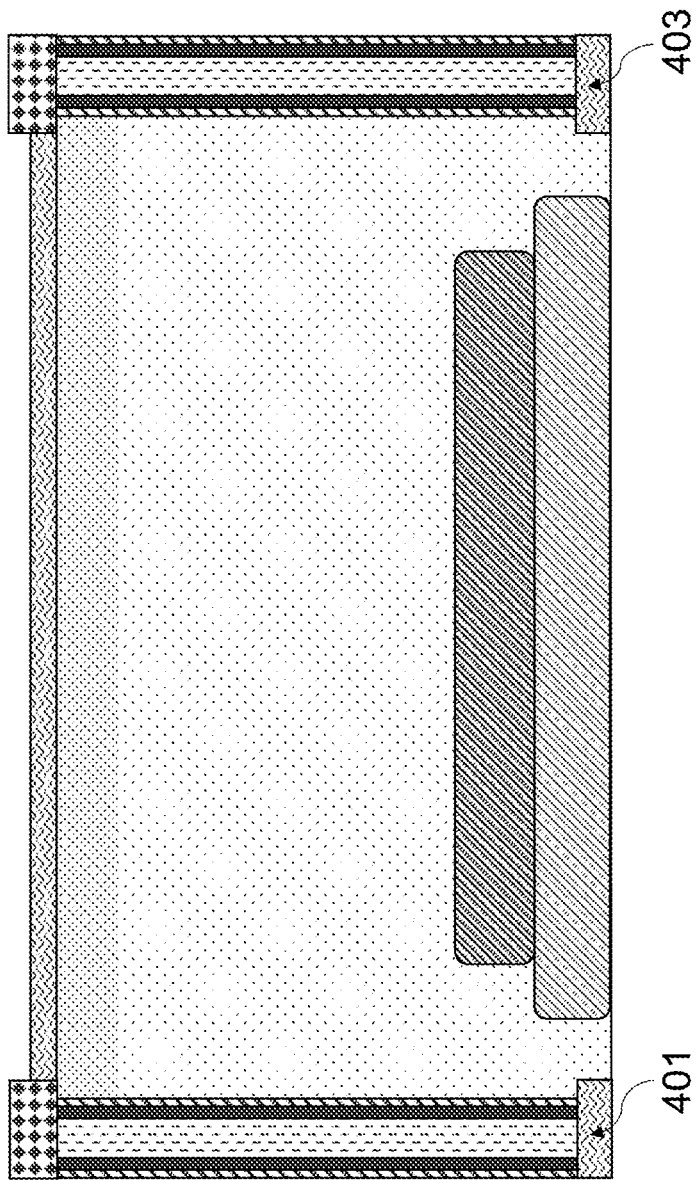
FIG. 4 is a simplified cross-sectional view diagram of a device according to an alternative embodiment of the present invention.

FIG. 4 is a simplified cross-sectional view diagram of a device according to an alternative embodiment of the present invention. This diagram is merely an example, which should not unduly limit the scope of the claims herein. As shown, the device can include a shallow trench isolation 401, 403 below the deep trench isolation (which was referred to as the surrounding trench region). In an example, the shallow trench isolation can include an oxide material as a filler.

Figure 5:
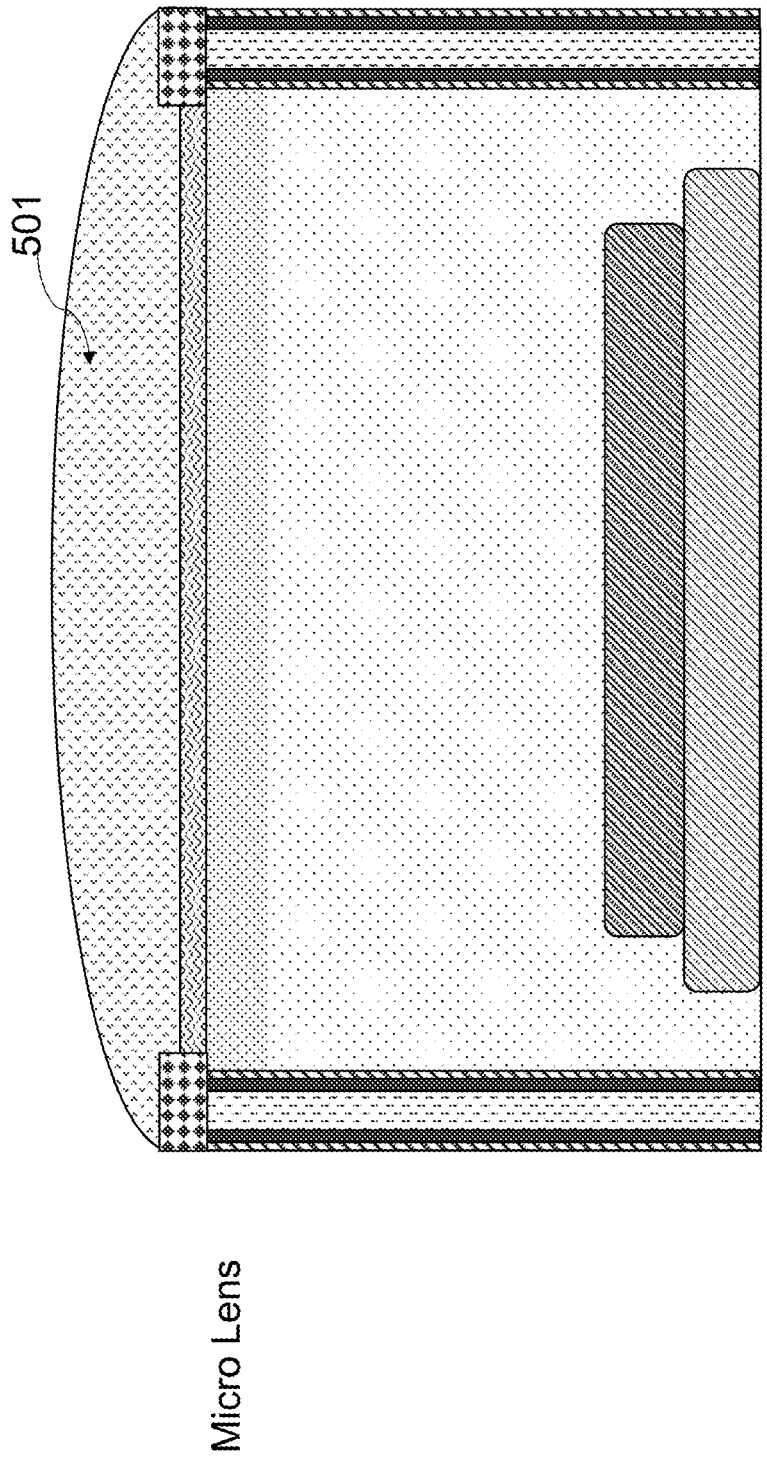
FIG. 5 is a simplified cross-sectional view diagram of a device according to an alternative embodiment of the present invention.

FIG. 5 is a simplified cross-sectional view diagram of a device according to an alternative embodiment of the present invention. This diagram is merely an example, which should not unduly limit the scope of the claims herein. As shown, the device can include a micro lens 501 configured overlying the surface of the substrate. In an example, the micro lens is configured to focus incoming light onto active regions of the epitaxial material. In an example, the micro lens can be monolithically integrated or made of an optical material that is mechanically attached to the passivation layer. Of course, there can be other variations, modifications, and alternatives.

Figure 6:
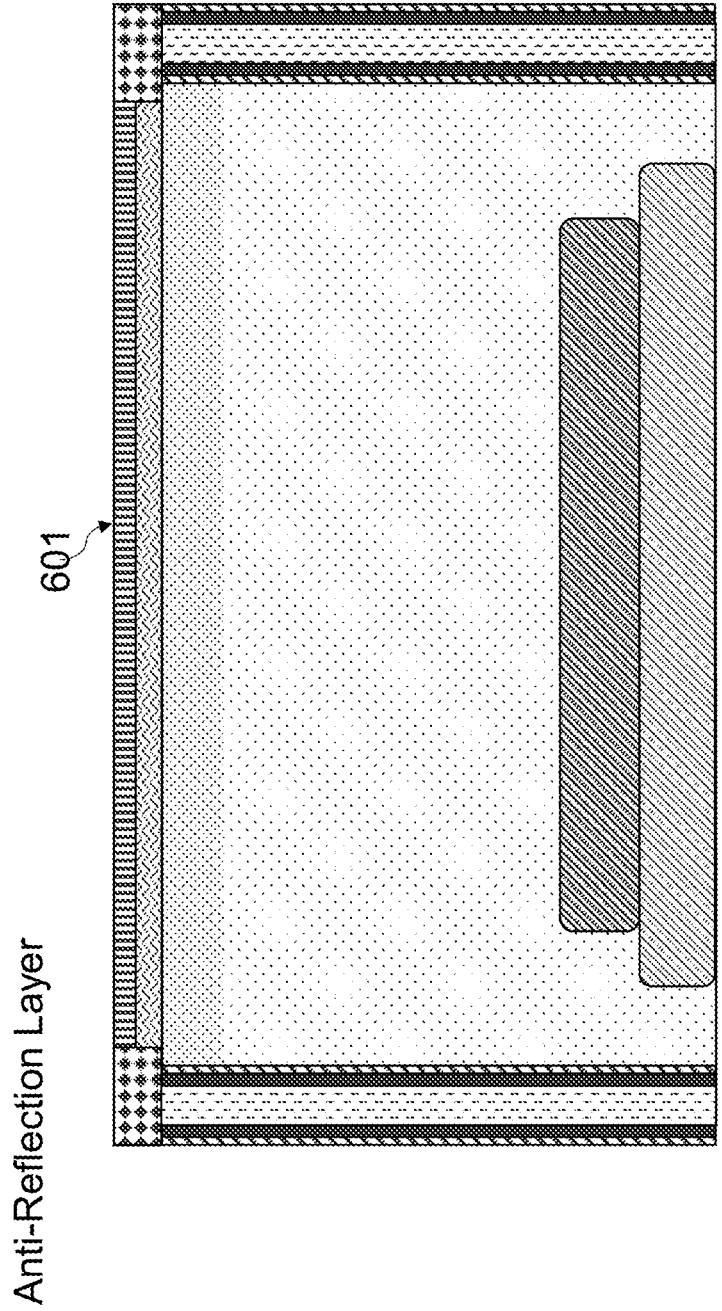
FIG. 6 is a simplified cross-sectional view diagram of a device according to an alternative embodiment of the present invention.

FIG. 6 is a simplified cross-sectional view diagram of a device according to an alternative embodiment of the present invention. This diagram is merely an example, which should not unduly limit the scope of the claims herein. In an example, the device has an anti-reflective material 601 overlying a backside of the device. In an example, the anti-reflective layer can be any optical material, such as an oxide, a nitride, or metal oxides, or other suitable materials, or combinations thereof, or the like. In an example, the anti-reflective coating reduces light refraction at the backside surface, which allows more light to travel into an active device region.

Figure 7:
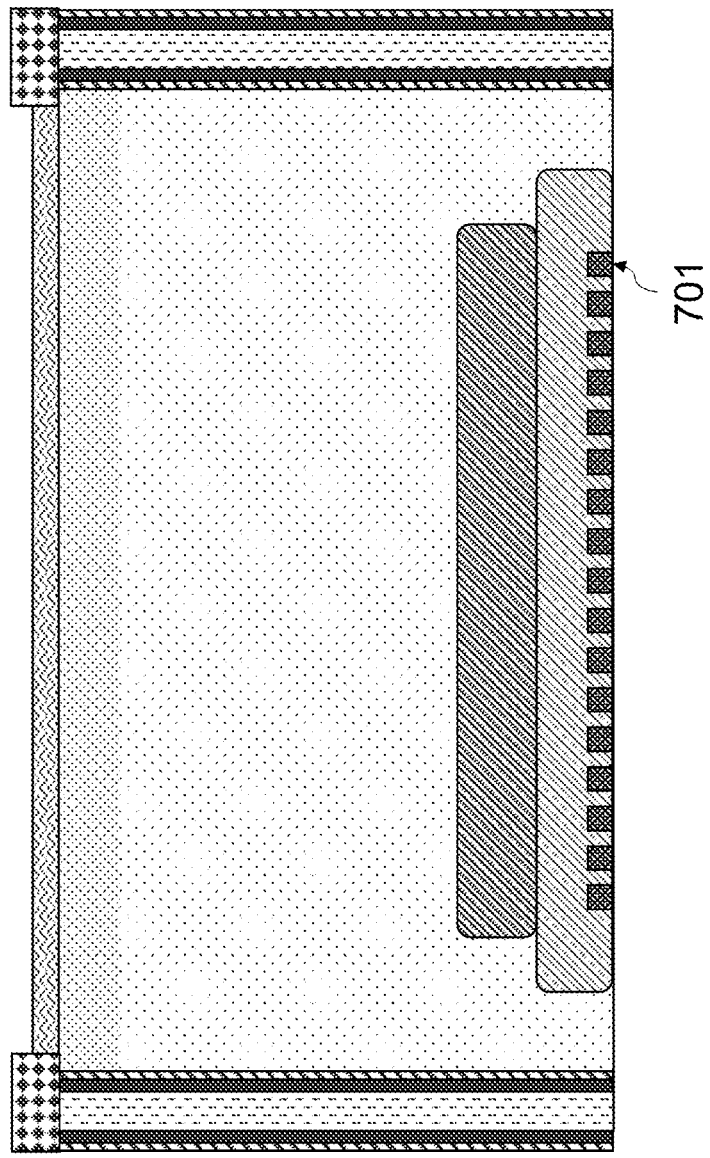
FIG. 7 is a simplified cross-sectional view diagram of a device according to an alternative embodiment of the present invention.

FIG. 7 is a simplified cross-sectional view diagram of a device according to an alternative embodiment of the present invention. This diagram is merely an example, which should not unduly limit the scope of the claims herein. As shown, the device has nanostructures 701. That is each of the pixel elements comprises a plurality of nano-structures configured within a vicinity of an interface to the upper surface to facilitate trapping of a photon coming in contact with the nano-structure. In an example, the nano-structures can be made on the sensor substrate. In an example, the nano-structures are made using one or more of the following processes.

In an example, light trapping works by coupling incoming photons into a lateral waveguide mode that increases absorption length. In an example, as shown, nano-structures are formed using a periodic pattern (or can also be unpatterned in other examples) made by using a dry etching or selective wet etching of a silicon bearing material. In an example, dry etching of silicon bearing material causes formation of rectangular, or circular, or hexagonal shapes, or other shapes, of holes or openings. In an example, for silicon, the period of the nano-structures can be in the range of 650-850 nm, and a diameter of the nano-holes or openings can be in the range of 400-600 nm, although there can be other variations. In an example, to be compatible with CMOS STI (shallow trench isolation) processes, the depth of nano structures can be in the range of 300-450 nm, but can be others. After dry etching, the nano holes are oxidized and filled with an oxide fill material.

In an example, nano structures can also be made by a selective wet etching process. In an example, selective wet etching creates an inverse pyramid of holes or openings as shown. In an example, the period of the inverse pyramid can be in the range of 700-900 nm, among others. In an example, the depth of the inverse pyramid depends on the period of the pyramid because of a fixed angle of pyramid resulted from crystal direction. After wet etching, the pyramids are also oxidized and filled with oxide fill material. Further details of the present nanostructure configuration can be found throughout the present specification.

Figure 8:
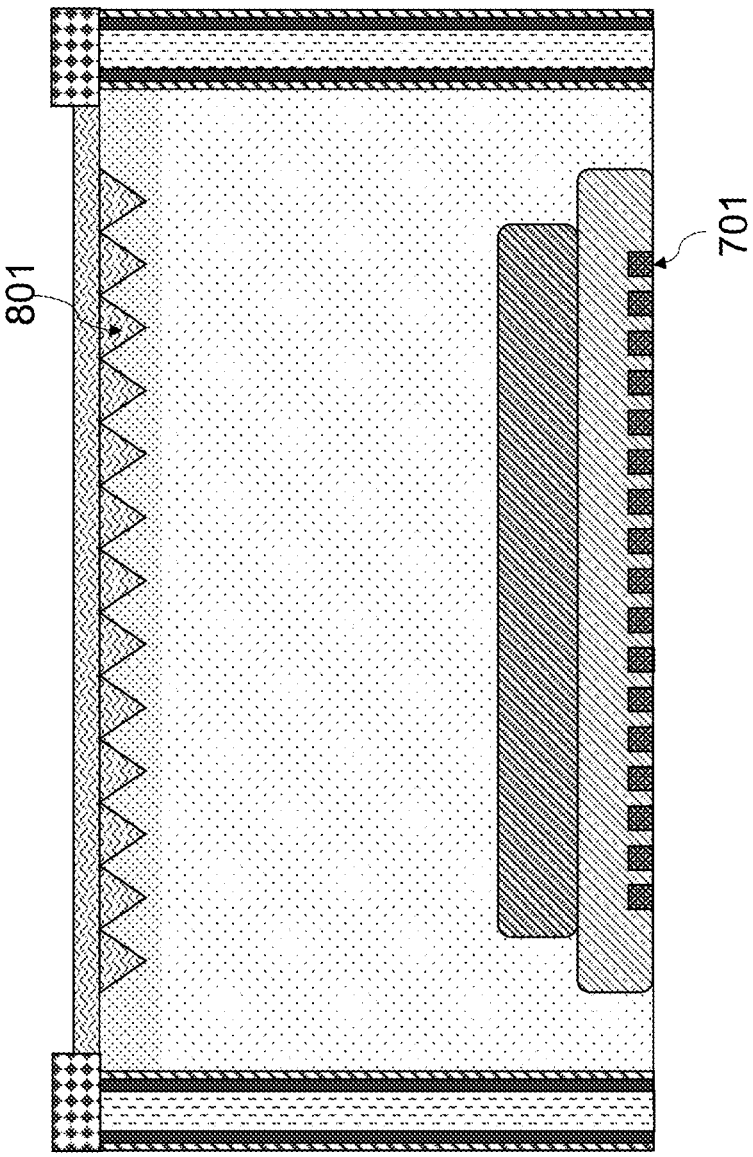
FIG. 8 is a simplified cross-sectional view diagram of a device according to an alternative embodiment of the present invention.

FIG. 8 is a simplified cross-sectional view diagram of a device according to an alternative embodiment of the present invention. This diagram is merely an example, which should not unduly limit the scope of the claims herein. In an example, each of the pixel elements comprises a plurality of nano-structures 801 configured overlying the aperture region to facilitate trapping of a photon coming in contact with the nano-structure. In an example, the nano-structure is configured from a silicon material. As shown, nanostructures 701 are configured within a vicinity of the interface region, and nanostructures 801 are configured within a vicinity of the aperture region.

Figure 9:
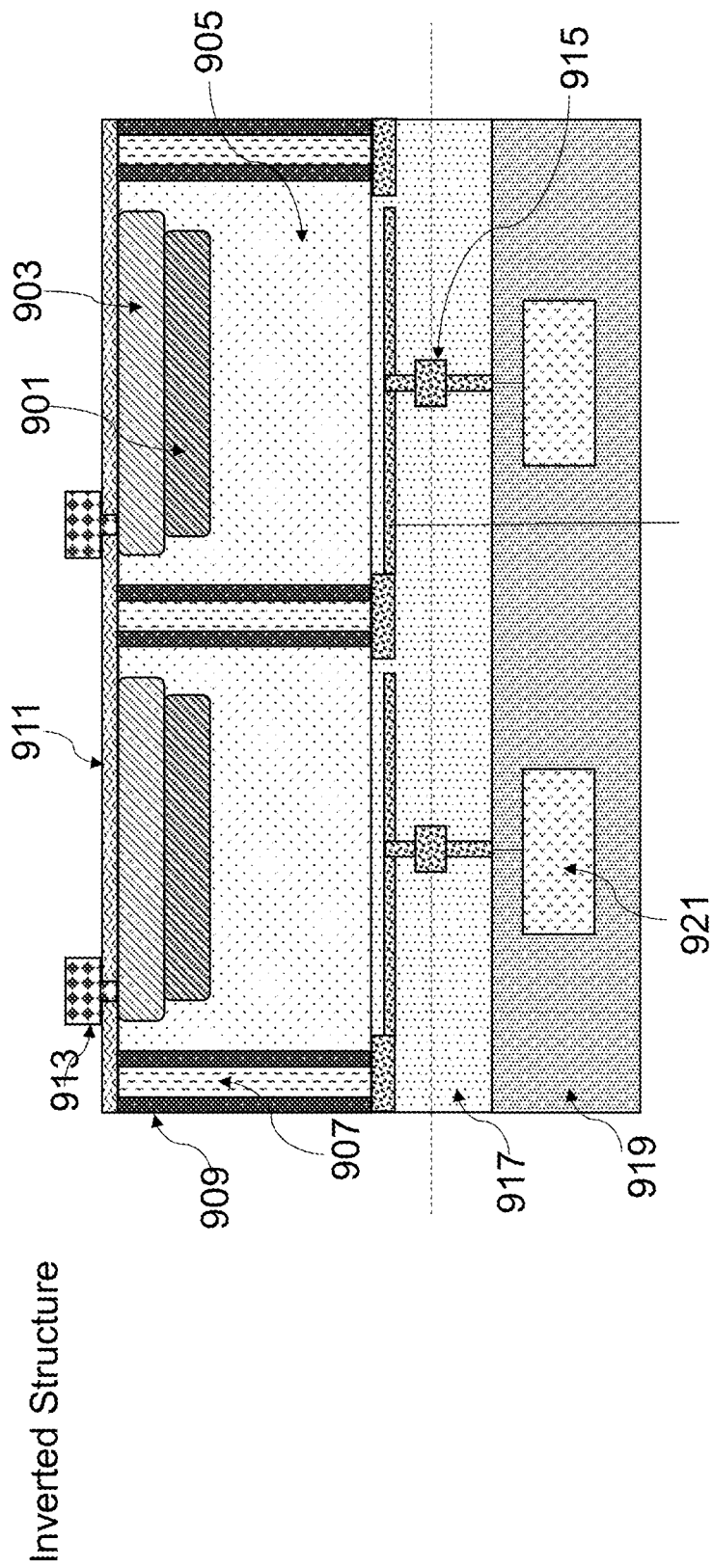
FIG. 9 is a simplified cross-sectional view diagram of a device according to an alternative embodiment of the present invention.

FIG. 9 is a simplified cross-sectional view diagram of a device according to an alternative embodiment of the present invention. This diagram is merely an example, which should not unduly limit the scope of the claims herein. As shown, the device can also be configured as an inverted structure. In an example, the implanted p-type material 901 and the implanted n-type 903 material are configured within a vicinity of an aperture region of the pixel element. The device also has epitaxial material 905 defined within a pixel element surrounded by a trench region. As shown, each trench region has a fill material 907, a dielectric material, and a charge layer (collectively reference numeral 909). The device has an overlying passivation material 911, which can be a silicon dioxide, silicon nitride, or combinations thereof. An upper contact region 913 is coupled to the n-type material, as shown. The device also has a lower contact region coupled to bonding point 915 and p-type material.

In an example, the device has a bottom metal reflector, as shown. In an example, the metal reflector can be made of an aluminum material, a metal/oxide material, or a semiconductor material. In an example, the bottom reflector is configured to reflect light back into an active region of the epitaxial material or active region.

In an example, the device has a logic substrate 919, which is a semiconductor substrate configured with logic circuitry. In an example, the substrate can be a complementary metal oxide silicon (CMOS) substrate, a blank or unpatterned substrate, a patterned, hybrid substrate, among others. In an example, the semiconductor substrate has a plurality of CMOS cells for logic circuitry, and can also include a plurality of memory cells, interface cells, and other circuit elements. As shown, the substrate has a bonding region 917 and logic circuits 921, which can be configured as an output, quenching, recharge circuit, among others. Of course, there can be other variations, modifications, and alternatives.

Figure 10:
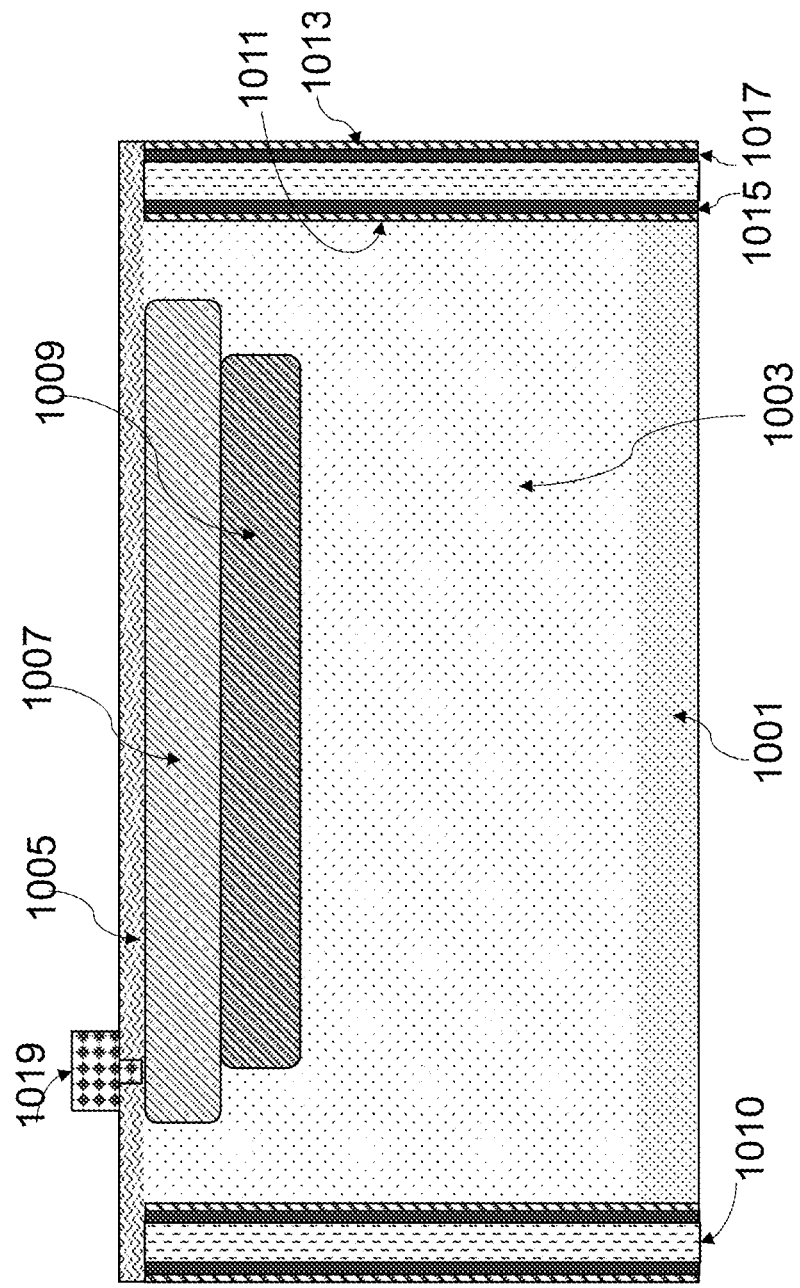
FIG. 10 is a simplified cross-sectional view diagram of a sensor device of FIG. 9 according to an alternative embodiment of the present invention.

FIG. 10 is a simplified cross-sectional view diagram of a sensor device of FIG. 9 according to an alternative embodiment of the present invention. This diagram is merely an example, which should not unduly limit the scope of the claims herein. As shown, the device can also be configured as an inverted structure. In an example, the implanted p-type material 1009 and the implanted n-type 1007 material are configured within a vicinity of an aperture region of the pixel element. The device also has epitaxial material 1003 defined within a pixel element surrounded by a trench region. As shown, each trench region has a fill material 1010, a dielectric material, and a charge layer 1015 1017, and a thin layer of dielectric material 1011 1013. The device has an overlying passivation material 1005, which can be a silicon dioxide, silicon nitride, or combinations thereof. An upper contact region 1019 is coupled to the n-type material, as shown. The device has a p+ type region 1001, as shown. The device also has a lower contact region coupled to bonding point.

In an example, the charge material configured at a deep trench isolation structure has a negative charge. In an example, high k dielectric material, such as $Al_2O_3$ deposited by atomic layer deposition techniques forms negative fixed charge at an $SiO2/Al2O3$ interface region. In an example, the negative fixed charge creates a positive flat band voltage shift, which causes semiconductor material near the deep trench isolation sidewall in accumulation mode rather than in a depletion mode. Additionally, spatially excluding the deep trench isolation sidewall interface from the depletion region greatly reduces chances for the interface defects to drift to the avalanche region. Accordingly, noise or the dark count rate can be greatly reduced.

These diagrams are merely examples, which should not unduly limit the scope of the claims herein. In light of the present invention disclosure, one of ordinary skill in the art would recognize many other variations, modifications, and alternatives. For example, various steps outlined above may be added, removed, modified, rearranged, repeated, and/or overlapped, as contemplated within the scope of the invention. It is also understood that the examples and embodiments described herein are for illustrative purposes only and that various modifications or changes in light thereof will be suggested to persons skilled in the art and are to be included within the spirit and purview of this process and scope of the appended claims.

The invention claimed is:

1. A single photon avalanche diode device comprising:
a logic substrate comprising an upper surface;
a sensor substrate bonded to the upper surface of the logic substrate, the sensor substrate comprising a plurality of pixel elements spatially disposed to form an array structure, each of the pixel elements comprising:
a passivation material comprising an opening;
an epitaxially grown p-type silicon material;
an implanted p-type material configured in a first portion of the epitaxially grown material; and
an implanted n-type material configured in a second portion of the epitaxially grown material;
a junction region configured from the implanted p-type material and the implanted n-type material; and
a deep trench region bordering the pixel element, the trench region comprising a fill material, a surrounding charge material, and a surrounding insulating material;
a first contact region on a first side of the sensor substrate coupled to the implanted p-type material, the first contact region being at least partially exposed through the opening;
a second contact region on a second side of the sensor substrate coupled to the implanted n-type material and the logic substrate; and
whereupon the charge material is configured with a negative charge to cause a plurality of holes within a vicinity of the surrounding charge material.

2. The device of claim 1 wherein each of the pixel elements comprises an anti-reflective material overlying the passivation material.

3. The device of claim 1 wherein each of the pixel elements having a size ranging from 1 micron to about 100 microns.

4. The device of claim 1 wherein the passivation material comprises an oxide material, a high-K dielectric material, a nitride material, or a polyimide material.

5. The device of claim 1 wherein the implanted p-type material comprises a boron material having a concentration density of 1E15 atoms/cm3 to 1E18 atoms/cm3.

6. The device of claim 1 wherein the implanted n-type material comprises a phosphorous entity or an arsenic entity having a concentration density of 1E17 atoms/cm3 to 1E19 atoms/cm3.

7. The device of claim 1 wherein the array structure is N by M, where N is 1 and greater and M is 1 and greater.

8. The device of claim 1 wherein the fill material comprises a metal material, a semiconductor material, or an insulating material.

9. The device of claim 1 wherein the implanted p-type material and the implanted n-type material are configured within a vicinity of the logic substrate of the pixel element.

10. The device of claim 1 wherein the logic substrate comprises a plurality of CMOS cells.

11. The device of claim 1 wherein each of the pixel elements comprises a plurality of nano-structures configured overlying the aperture region to facilitate trapping of a photon coming in contact with the nano-structure, the nano-structure being configured from a silicon material.

12. The device of claim 1 wherein each of the pixel elements comprises a plurality of nano-structures configured within a vicinity of an interface to the upper surface to facilitate trapping of a photon coming in contact with the nano-structure.

13. The device of claim 1 wherein each of the pixel elements comprises a reflective material configured on an opposite side of the aperture region to facilitate reflecting a photon from a underlying region to the junction region.

14. A single photon avalanche diode device comprising:
a logic substrate comprising an upper surface;
a sensor substrate comprising a back side and a front side, the front side being bonded to the upper surface of the logic substrate, the sensor substrate comprising a plurality of pixel elements spatially disposed to form an array structure, each of the pixel elements comprising:
an passivation layer overlaying the back side and comprising an opening;
an epitaxially grown p-type silicon material;
an implanted n-type material configured in a first portion of the epitaxially grown material;
an implanted p-type material overlying the n-type material and configured in a second portion of the epitaxially grown material;
a junction region configured from the implanted p-type material and the implanted n-type material; and
a deep trench region bordering the pixel element, the trench region comprising a trench opening, a surrounding insulating material, a surrounding charge material, and a fill material; and
a first contact region on the back side of the sensor substrate coupled to the implanted n-type material through the opening, the first contact region being at least partially exposed and positioned outside the epitaxially grown p-type silicon material; and a second contact region on a front side of the sensor substrate coupled to the implanted p-type material; and
whereupon the charge material is configured with a negative fixed charge to cause a plurality of holes within a vicinity of the surrounding charge material.

15. The device of claim 14 wherein each of the pixel elements comprises an anti-reflective material overlying the passivation material.

16. The device of claim 14 wherein each of the pixel elements having a size ranging from 1 micron to about 100 microns.

17. The device of claim 14 wherein the passivation material comprises an oxide material, a high-K dielectric material, a nitride material, or a polyimide material.

18. The device of claim 14 wherein the implanted p-type material comprises a boron material having a concentration density of 1E15 atoms/cm3 to 1E18 atoms/cm3.

19. The device of claim 14 wherein the implanted n-type material comprises a phosphorous entity or an arsenic entity having a concentration density of 1E17 atoms/cm3 to 1E19 atoms/cm3.

20. The device of claim 14 wherein the array structure is N by M, where N is 1 and greater and M is 1 and greater.

21. The device of claim 14 wherein the fill material comprises a metal material, a semiconductor material, or an insulating material.

22. The device of claim 14 wherein the implanted p-type material and the implanted n-type material are configured within a vicinity of an aperture region of the pixel element.

23. The device of claim 14 wherein the sensor substrate comprises a plurality of CMOS cells.

24. The device of claim 14 wherein each of the pixel elements comprises a plurality of nano-structures configured overlying the aperture region to facilitate trapping of a photon coming in contact with the nano-structure, the nano-structure being configured from a silicon material.

25. The device of claim 14 wherein each of the pixel elements comprises a plurality of nano-structures configured within a vicinity of an interface to the upper surface to facilitate trapping of a photon coming in contact with the nano-structure.

26. The device of claim 14 wherein each of the pixel elements comprises a reflective material configured on an opposite side of the aperture region to facilitate reflecting a photon from a backside region to the junction region.

* * * * *